United States Patent
Carbonera et al.

(10) Patent No.: US 7,856,285 B2
(45) Date of Patent: Dec. 21, 2010

(54) SYSTEM AND METHOD FOR GENERATING INSTRUCTIONS FOR CUSTOMIZATION

(75) Inventors: Carlos D. Carbonera, St. Paul, MN (US); Yuriy Malinin, Edina, MN (US)

(73) Assignee: Jostens, Inc., Minneapolis, MN (US)

( * ) Notice: Subject to any disclaimer, the term of this patent is extended or adjusted under 35 U.S.C. 154(b) by 111 days.

(21) Appl. No.: 12/016,881

(22) Filed: Jan. 18, 2008

(65) Prior Publication Data

US 2008/0177410 A1 Jul. 24, 2008

Related U.S. Application Data

(60) Provisional application No. 60/885,574, filed on Jan. 18, 2007.

(51) Int. Cl.
G06F 19/00 (2006.01)
(52) U.S. Cl. ...................................................... 700/98
(58) Field of Classification Search ................... 700/98, 700/117, 118, 159, 233, 160, 182, 180; 409/79, 409/80, 117, 132; 164/4.1
See application file for complete search history.

(56) References Cited

U.S. PATENT DOCUMENTS

| 7,069,108 | B2 | 6/2006 | Saarela et al. | |
|---|---|---|---|---|
| 2004/0111178 | A1* | 6/2004 | Saarela et al. | 700/193 |
| 2006/0001664 | A1* | 1/2006 | Carbonera | 345/419 |

OTHER PUBLICATIONS

Wick et al.; "Tool and Manufactruing Engineers Handbook"; 1998; Society of Manufactruing Engineers; vol. 3; chapter 15; pp. 15-1, 15-2 and 15-25.*
Wirth, Joachim, "Rapid Modeling", Carl Hanser Verlag, Munchen, 2002: 60-62;170-177.
Wirth, Joachim, "Rapid Modeling", Carl Hanser Verlag, Munchen, 2002: 60-62; 170-177.

* cited by examiner

*Primary Examiner*—Albert DeCady
*Assistant Examiner*—Chad Rapp
(74) *Attorney, Agent, or Firm*—Dorsey & Whitney LLP

(57) ABSTRACT

A method of creating a triangulated surfaces for generating machine readable instructions for customization is provided. The method comprises selecting text or symbols. The text or symbols are spaced. The text or symbols are mapped between first and second curves. Triangulated surfaces are generated from the mapped text or symbols. The triangulated surfaces are converted to machine readable instructions.

18 Claims, 19 Drawing Sheets

US 7,856,285 B2

SYSTEM AND METHOD FOR GENERATING INSTRUCTIONS FOR CUSTOMIZATION

FIELD

The present disclosure relates to a system and method for generating instructions for customization. More specifically, the present disclosure relates to a system and method for creating triangulated surfaces convertible to a series of machine readable instructions for the generation of a tool path, photorealistic image, or rapid prototyping model for customization of an item.

BACKGROUND

Personalized rings are popular and include, for example, class rings, championship rings, and affiliation rings. With particular reference to class rings, these rings have been a popular keepsake among students for generations. Originally, class rings were relatively uniform and provided students little opportunity to express themselves. Over time, automated manufacturing processes made it possible to provide students customizing choices. Modern students are driving the class ring market toward a level of customization that has been previously economically impractical using present manufacturing methods.

Personalized rings include several areas that may be customizable for a particular student or school. As shown in FIG. 1, a class ring 2 includes a shank 4 having graphics or text, a stone or face 6, and a bezel 8 having text. The bezel 8 is the portion of the ring 2 surrounding the gemstone or face 6. The bezel 8 comprises the groove holding the gemstone 6 in place and may further comprise a band with text surrounding the gemstone 6. FIG. 1 illustrates a bezel 8 such as is generally provided on class rings. As shown, the bezel 8 includes text such as the name of a school.

Most recently, computer aided design/computer aided manufacturing (CAD/CAM) technology has been used to provide the text on the bezel. CAD/CAM has facilitated producing customized rings in large quantities. The present level of customization provides personalized features such as: student's name, school name, graduation year, icons, academic degrees, and the like.

Traditionally, the use of CAD/CAM in the jewelry industry has been primarily focused on the manufacture of custom molds and engraving or otherwise machining the jewelry directly. These two approaches have limitations. Machining molds using CAD/CAM is too expensive for single-use custom applications. Engraving jewelry is also expensive due to the precious metal lost to scrap, manufacturing errors, and ordering errors.

CAD/CAM technology can be difficult to automate for the purpose of making personalized products. In one legacy system, a CAD/CAM operator manually manipulates a geometric model of a ring by grabbing a surface on the blank geometric model, defining the boundary splines, projecting the text or graphic onto the surface and then instructing the CAD/CAM software to generate machining instructions for the geometric model that has been created. The machining instructions result in a desired toolpath for a computer numerically controlled ("CNC") milling machine. Using human operators to repeat these steps manually in order to generate the machining instructions for thousands of individual, personalized rings is cost prohibitive.

U.S. Pat. No. 7,069,108 for Automated Engraving of a Customized Jewelry Item, issued Jun. 27, 2006 discloses an automated system for personalizing a class ring and is herein incorporated by reference in its entirety.

BRIEF SUMMARY

Systems and methods for creating triangulated surfaces convertible to a series of machine readable instructions for the generation of a tool path, photorealistic image, or rapid prototyping model for customization of an item are provided. More specifically, in one embodiment, an automated method for creating triangulated surfaces convertible to a tool path for customization of a bezel is provided.

In one embodiment, a method of creating a triangulated surfaces for engraving an item is provided. The method comprises selecting text or symbols. The text or symbols are spaced and mapped between first and second curves. Triangulated surfaces are generated from the mapped text or symbols.

In one embodiment, a method for creating a triangulated surface convertible to a series a machine readable instructions is provided. The method comprises defining a shape for placement of text and/or symbols and defining the text and/or symbols for placement on the shape. The text and/or symbols are placed on the shape as triangulated surfaces. The triangulated surface is converted to machine readable instructions for generation of a customized item.

In one embodiment, a computer-readable medium encoded with a computer program code for creating a triangulated surface convertible to a series a machine readable instructions is provided. The program code causes a computer to execute a method which comprises defining a shape for placement of text and/or symbols and defining the text and/or symbols for placement on the shape. The text and/or symbols are placed on the shape as triangulated surfaces. The triangulated surface is converted to machine readable instructions for generation of a desired output.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed description is to be regarded as illustrative in nature and not restrictive.

DETAILED DESCRIPTION

Systems and methods for creating triangulated surfaces convertible to a series of machine readable instructions for the generation of a tool path, photorealistic image, or rapid prototyping model for customization of an item are provided. While the present disclosure describes an exemplary embodiment of the system and method in the context of creating triangulated surfaces convertible to a tool path for customizing a bezel, it should be appreciated that this is for illustrative purposes only and the system and method of the present disclosure may be used convert triangulated surfaces to machine readable instructions for any purpose.

Figure 1:
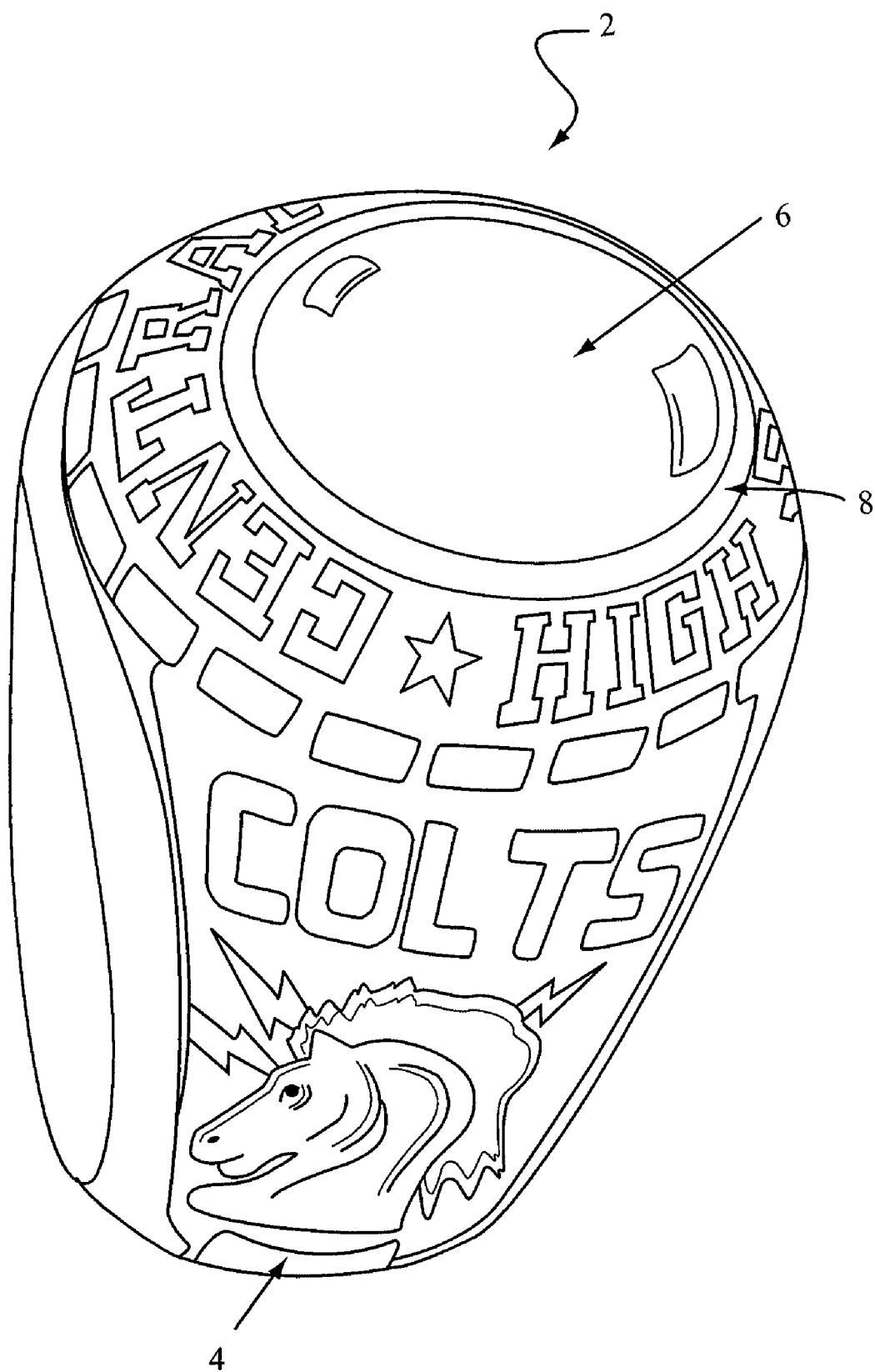
FIG. 1 illustrates a class ring.
Figure 2A:
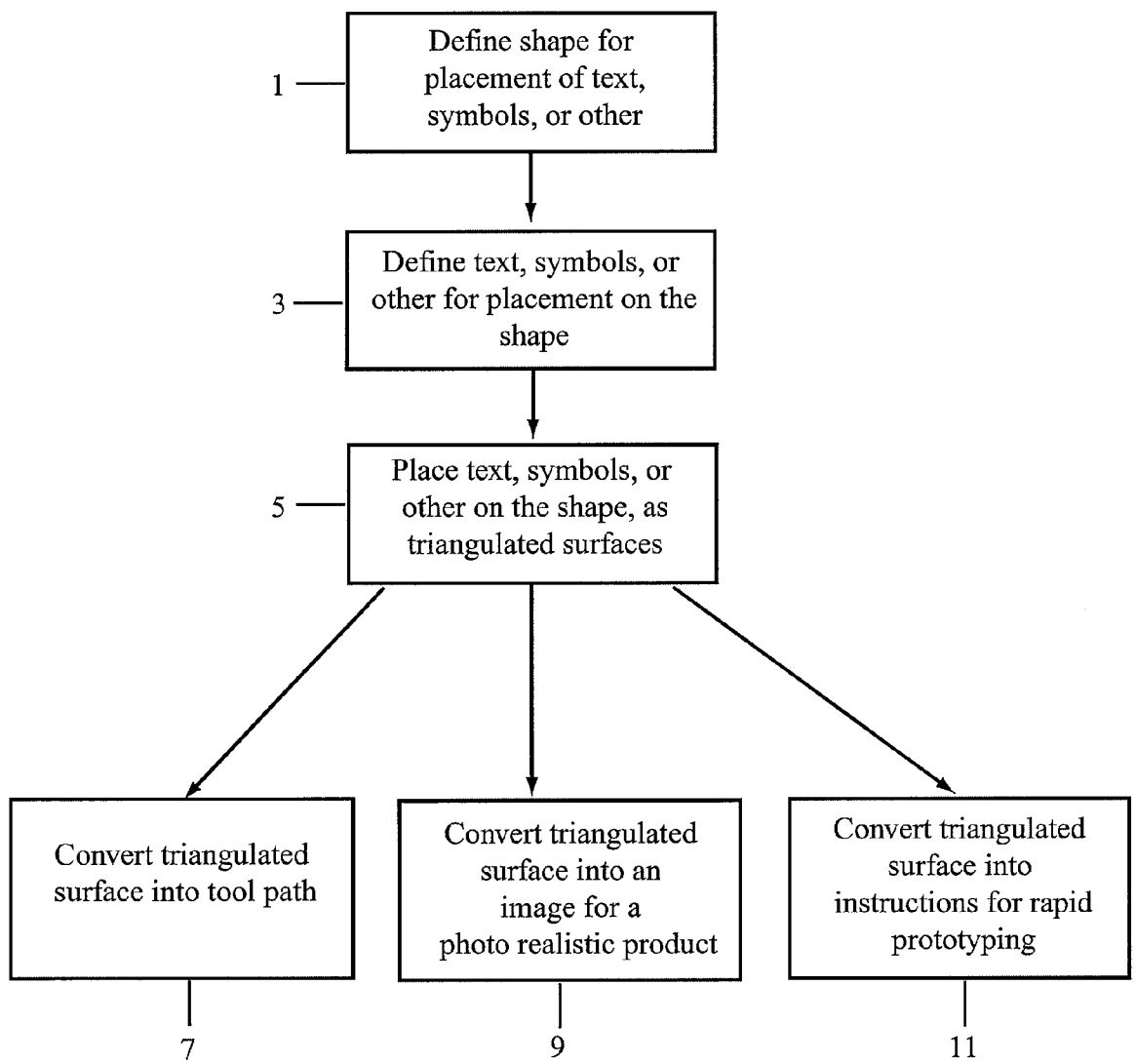
FIG. 2a illustrates a workflow diagram of a process for developing triangulated surfaces and converting such surfaces to a set of machine readable instructions for customization of an item in accordance with one embodiment.

FIG. 2a is a workflow diagram of a method of a process for developing triangulated surfaces and converting the triangulated surfaces to machine readable instructions for customizing an item. As shown, a shape for placement of text, symbols, or other is defined [block 1]. Additionally, the text, symbols, or other for placement on the shape are defined [block 3]. The text, symbols, or other, are placed on the shape, as triangulated surfaces (or vertexes), in accordance with the method described with respect to FIG. 2b [block 5]. Thereafter, the triangulated surfaces are converted to machine readable instructions for creating a desired output. For example, the triangulated surfaces of block 3 may be converted to a tool path for creating, for example, a jewelry item, pen, clock, or other engravable item [block 7]. Alternatively, the triangulated surfaces of block 3 may be converted into an image for a photo realistic product such as a poster or printed card [block 9]. Alternatively, the triangulated surfaces may be converted into instructions for rapid prototyping [block 11]. Generally, the triangulated surface may be converted to machine readable instructions or other for use in creating a customized item.

Figure 2B:
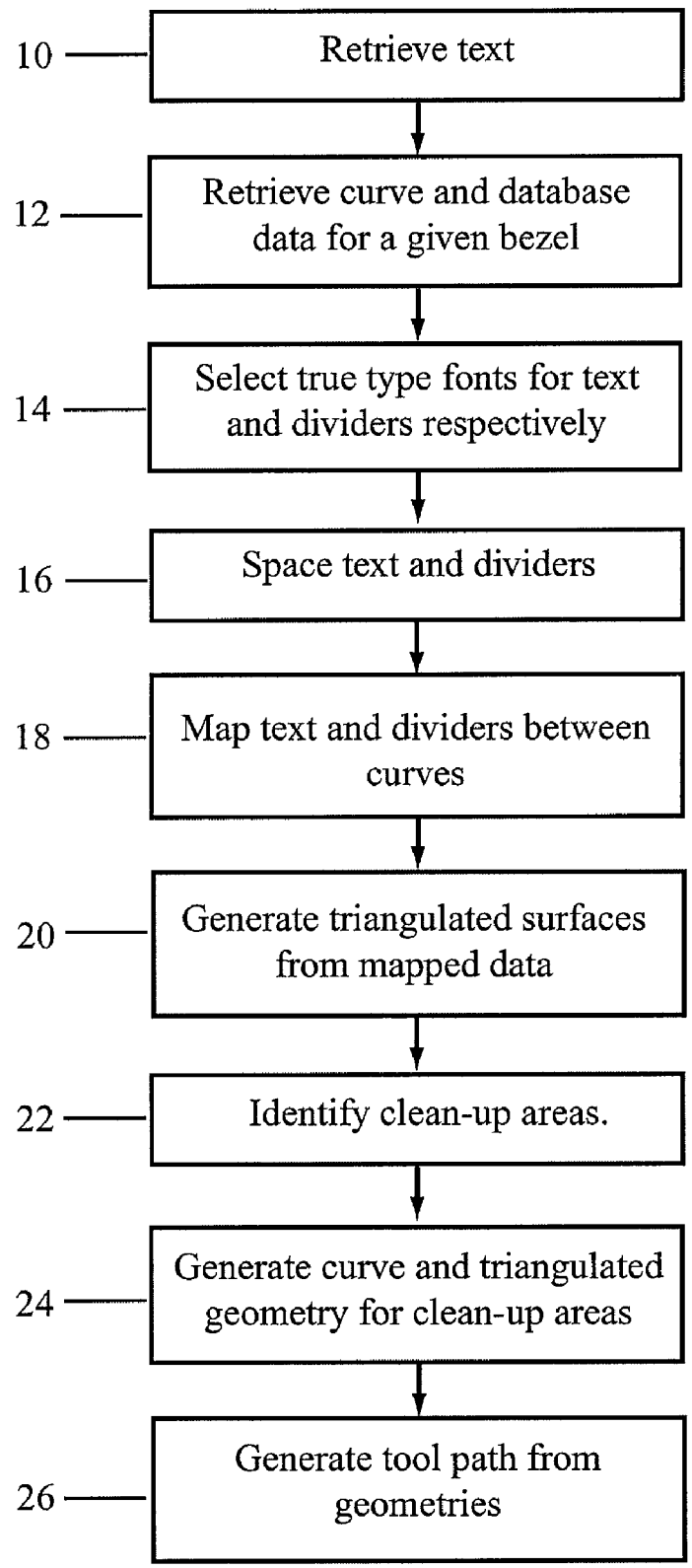
FIG. 2b illustrates a workflow diagram of an automated method for engraving a bezel in accordance with one embodiment.

FIG. 2b is a workflow diagram illustrating an automated method of engraving a bezel of a personalized ring in accordance with one embodiment. Thus, FIG. 2b illustrates an exemplar embodiment of blocks 1, 2, and 3 of FIG. 2a. Personalized rings include a plurality of panels that may be personalized by a school or purchaser. While the present disclosure makes specific reference to the bezel of the ring and customizing the bezel of the ring, it is to be understood by one skilled in the art that portions of the disclosed method may be used to customize or personalize other panels of a ring, other pieces of jewelry, or other non-jewelry objects such as for example, pens, clocks, keychains, automobiles, and the like.

As shown, text is entered or retrieved for placement on the bezel [block 10] and curve and database data for a given bezel is retrieved [block 12], discussed more fully below. A font type may be selected for the text. Alternatively, as will be described more fully below, the font type may be determined during ring selection and thus automatically set for the system. In the embodiment shown, a TrueType brand typographic font is selected for the text [block 14]. The text is spaced and placement of the dividers is set based on the entered text [block 16]. The entered text and dividers are mapped between curves [block 18] and triangulated surfaces are generated from the mapped data [block 20]. Areas that will need further tooling are identified [block 22] and clean-up geometry for a tool path is generated [block 24]. The final step in the workflow diagram of FIG. 2b is creating a tool path [block 26]. It is to be appreciated that in various embodiments of generating instructions for customization, some of the steps may not be performed and or other steps may be performed. For example, in some embodiments, clean-up geometry may not be generated.

Referring still to FIG. 2b, in one embodiment, a first line of text and a second line of text are retrieved or entered [block 10]. Now referring to FIG. 3, in one embodiment, the first line of text 30 appears over the gemstone 6 or face of the ring and the second line of text 32 appears under the gemstone 6 or face of the ring. As previously discussed, dividers 34 may be selected for placement between the first and second lines of text 30, 32 [block 12 of FIG. 2b].

Figure 4:
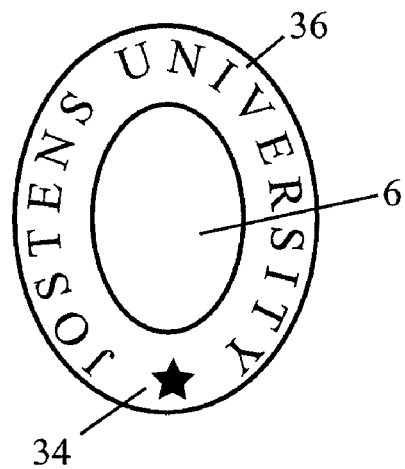
FIG. 4 illustrates an exemplary bezel having a single text curve created using the method of FIG. 2.

In embodiments having first and second lines of text 30,32, all entered text may be facing in the same direction when the ring is manufactured. Alternatively, a single divider 34 may be selected for placement at the end of a single line of text 36, as shown in FIG. 4. Thus, using only a single line of text 36, the text wraps around the gemstone 6 and changes direction such that it appears upright over the gemstone 6 and upside down under the gemstone 6.

Figure 3:
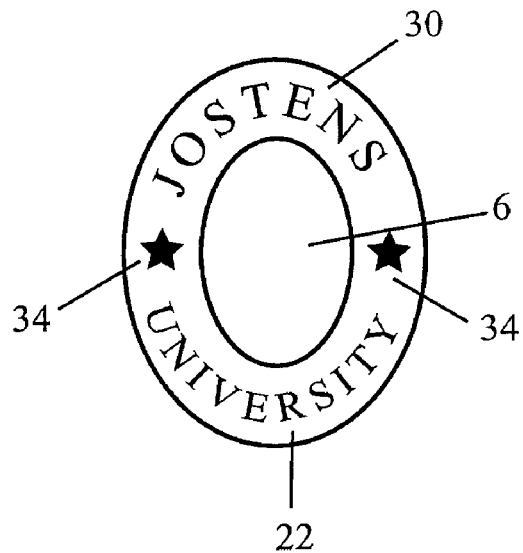
FIG. 3 illustrates an exemplary bezel having a top text curve and a bottom text curve created using the method of FIG. 2.

Referring again to FIG. 2b, using the system and method, the text is spaced and placement of the dividers 34 is set based on the entered text for the first and second lines 30, 32 [block 16], for a ring such as shown in FIG. 3, or for a single line of text 36 for a ring such as shown in FIG. 4.

Figure 5:
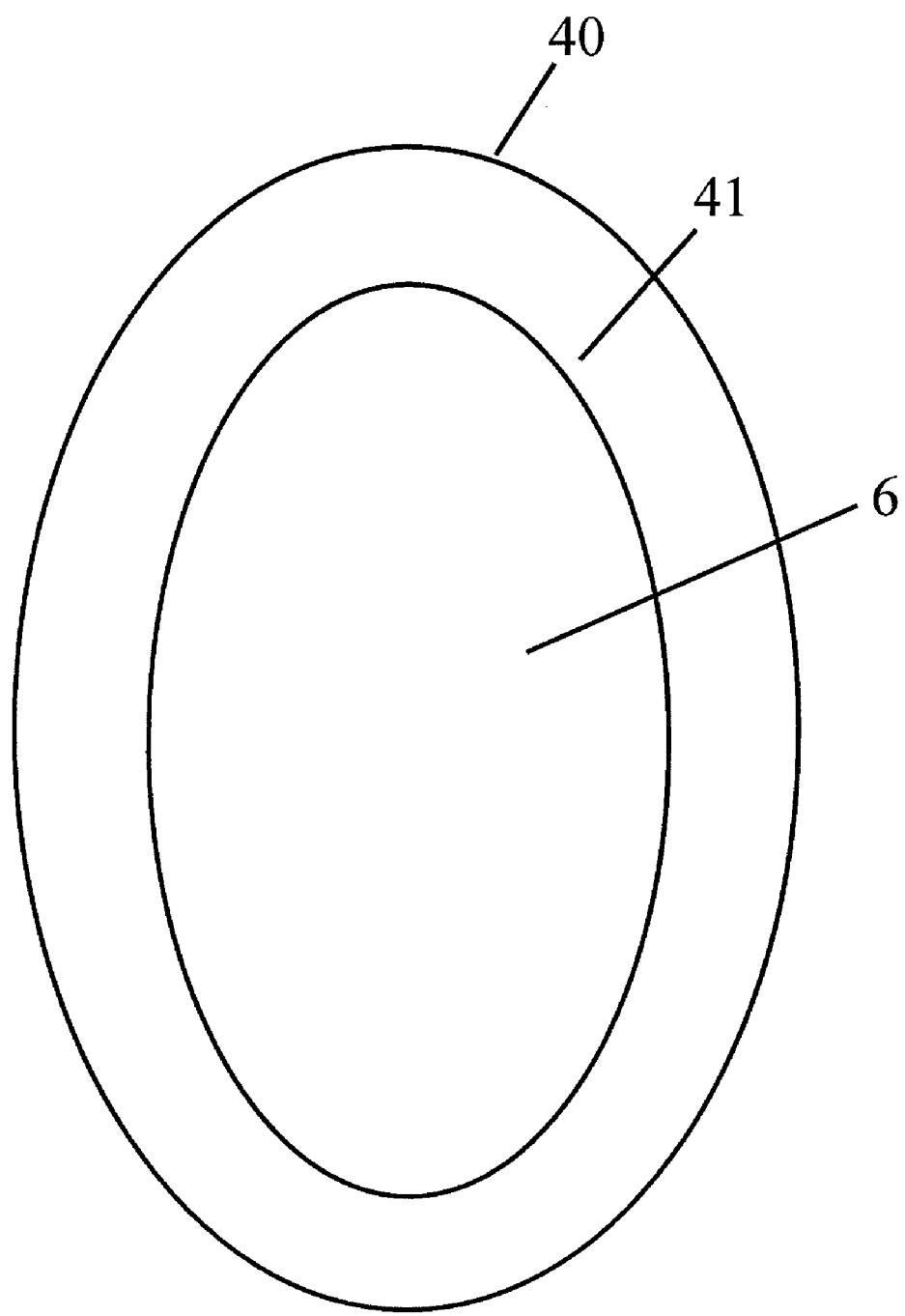
FIG. 5 illustrates text mapping between two closed curves in accordance with one embodiment.

As described with reference to FIG. 2b, the entered text and dividers are mapped between curves [block 18]. The entered text and dividers may be mapped between two closed curves 40, 41, as shown in FIG. 5. The shape of the curves may be any suitable shape. Further, the two curves may have varying shapes. The shape of the curves 40, 41 may be preselected based on the shape and size of the ring. Thus, referring back to FIG. 2b, curve and database data for a given bezel may be retrieved [block 12] and the text and dividers spaced based on that data [block 16]. The entered text and dividers are converted into surfaces. More specifically, triangulated surfaces are generated from the mapped data [block 20].

Figure 14:
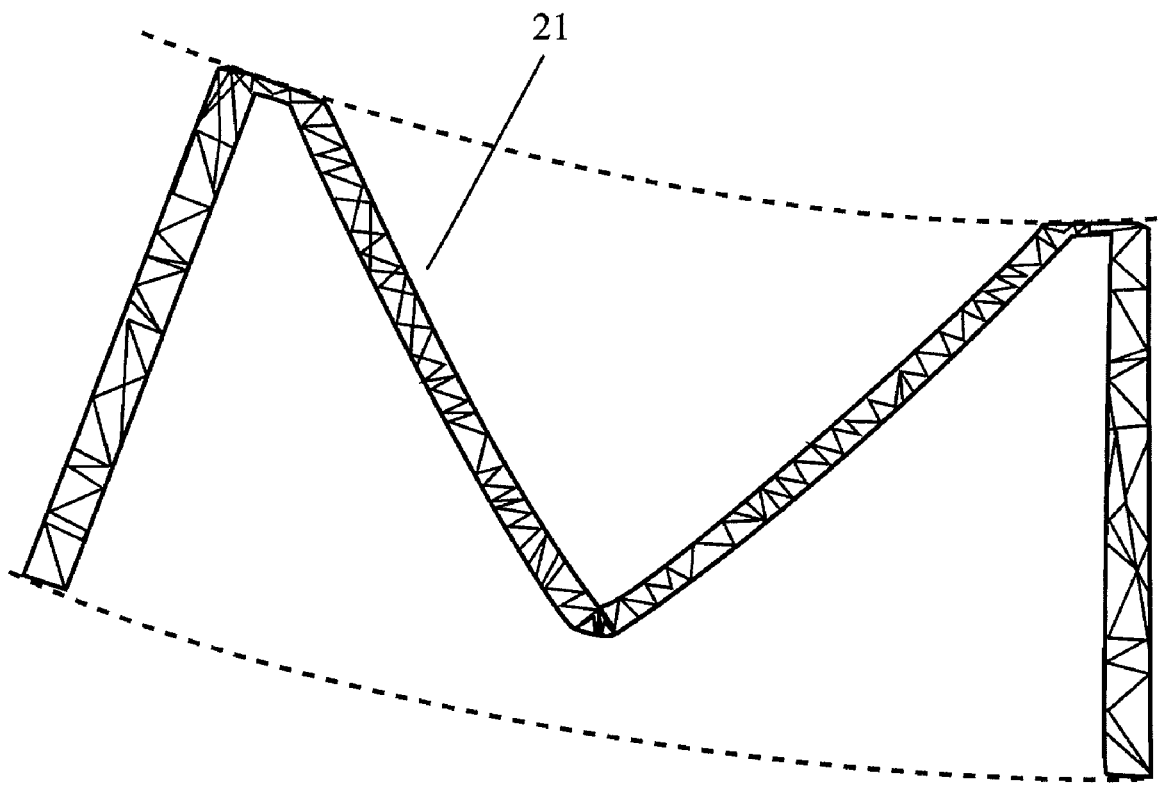
FIG. 14 illustrates the detail of a single character M represented as triangulated data that has been mapped between the upper text curve, and the lower text curve in accordance with one embodiment.
Figure 15:
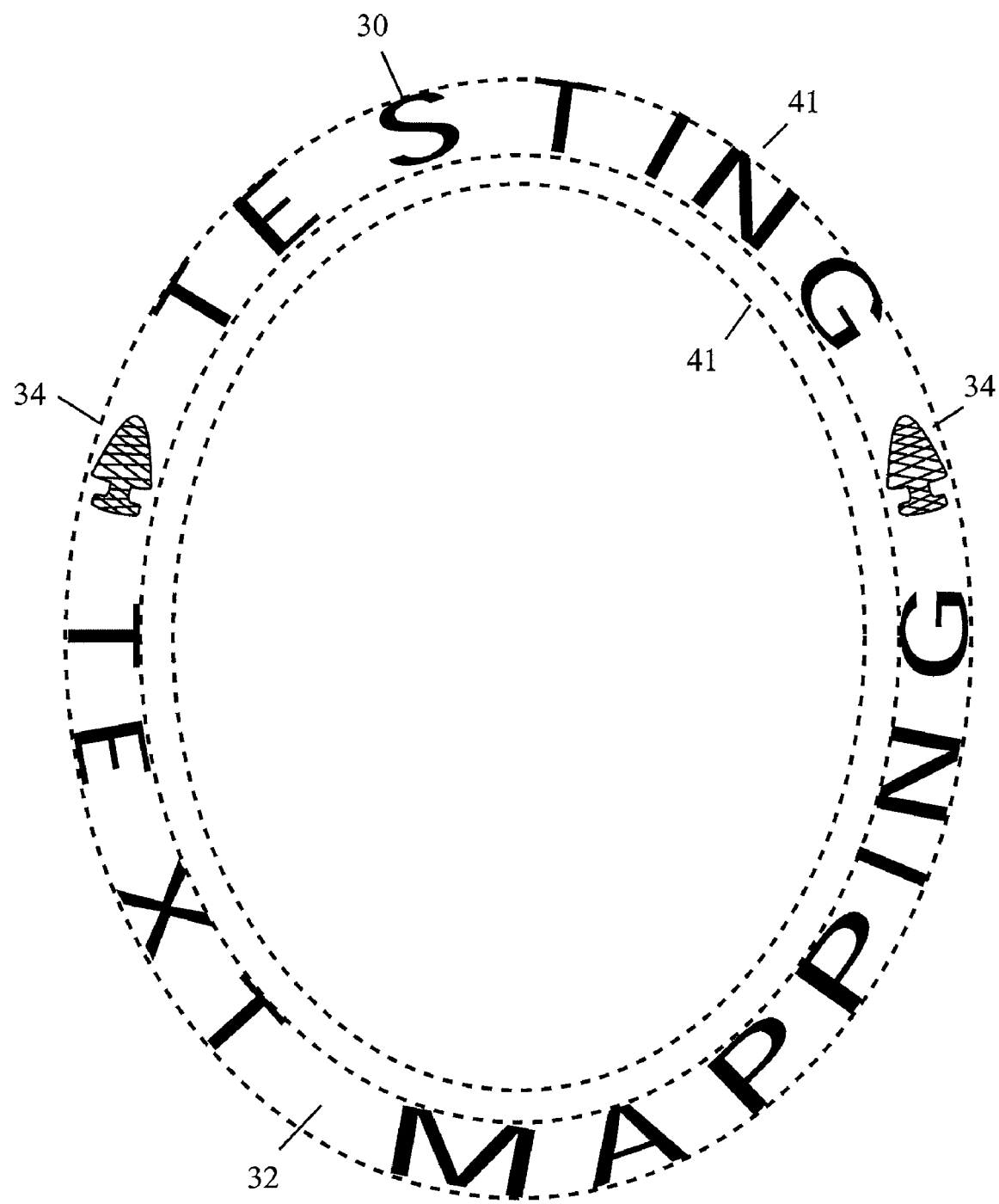
FIG. 15 illustrates text and dividers represented as triangulated data that has been mapped between the upper text curve and the lower text curve in accordance with one embodiment.

FIG. 14 illustrates the triangulation of a single character M 21 after being mapped. FIG. 15 illustrates the text 30, 32 and dividers 34 mapped and triangulated between the upper and lower closed curves 40, 41. The upper and lower closed curves 40, 41 may alternatively be referred to as upper and lower text curves. Thus, the system and method spaces the text 16, maps the text and dividers between upper and lower curves 16, and generates triangulated surfaces 20. In some embodiments, the triangulated surfaces are used to generate a tool path, described more fully below with reference to FIG. 6, that typically is output as curves. While FIGS. 3-5 depict bezels having a generally annular shape, it is to be appreciated that system and method of the present disclosure may be used to automatically generate toolpaths for bezels having any shape, such as for example, square, rectangular, and polygonal. In various embodiments, the triangulated surfaces may be converted into any machine readable instructions or other for creating a customized item.

Figure 6:
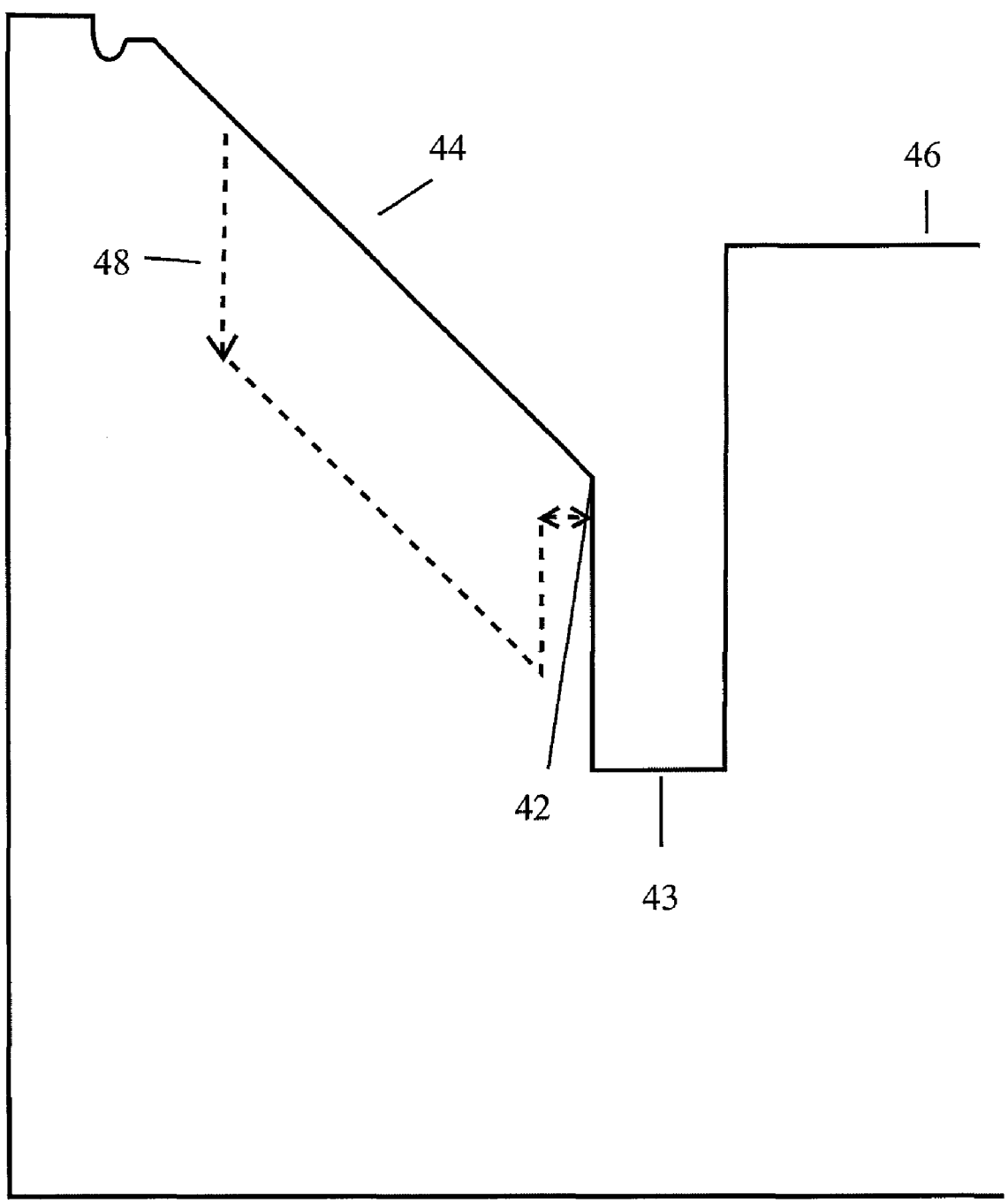
FIG. 6 illustrates the text area, space, and tear drop for a standard class ring.

Referring again to FIG. 2b, areas that will need further tooling are identified [block 22] and clean-up geometry (including curves and/or triangulated surfaces) for a tool path are generated [block 24]. These areas generally are along the bottom edges of letters and/or within islands of letters. Islands of letters are the embedded portions of letters, for example the top and bottom circle within a capital B. The clean-up lines largely eliminate sharp edges and burrs. In the past, these areas, including the sharp edges and burrs, have been hand-finished using tooling. Such hand-finishing is time consuming, thus increasing manufacturing costs, and can result in error requiring replacement of the ring. For example, hand tooling often is done to clean up along the bottom edge of letters or along the inner edge of the bezel. As shown in FIG. 6, a space 43 is provided along the bottom edge 42 of the text 44, the space 43 being provided between the text 44 and a teardrop 46. The mapped triangulated text 44 between the upper and lower curves is placed at a specific depth of cut 48. The space 43 is used during generation of a wax mold for the ring to create a metallic portion that is used as a wall around the gemstone. During hand finishing, a tooling burr may hit the tear drop and, thus, wax is not able to flow into the space to create the metallic portion for the wall. Thus, if the tear drop 46 is hit by the burr, a new ring must be created. Generating clean up geometry [block 24] and then creating a tool path over the clean-up geometry minimizes hand tooling and gives more consistency to the creation of rings. Clean up geometry (including lines and/or curves) may also be generated between letters to minimize the sharp edges between letters. Identifying areas needing clean-up [block 22] comprises estimating where sharp edges result and generating a curve along the sharp edge. The curve, or clean-up line, may then be converted into a tool path.

The triangulated surfaces of the text and dividers and the curves and/or triangulated geometries of the clean-up areas thus comprise a geometry that is convertible to machining instructions and a tool path. Accordingly, the final step in the workflow diagram of FIG. 2b is creating a tool path [block 26]. It is to be noted that such creation may not be done by the system and method and may instead be done using by a further system using the geometry created by the system and method.

Thus, FIG. 2b illustrates the mapping of text to create a tool path. As discussed with respect to FIG. 2a, mapping of text may alternatively be used to create machine readable instructions or other for generating a customized item such as photo realistic images, an item manufactured via rapid prototyping, or other.

Figure 7:
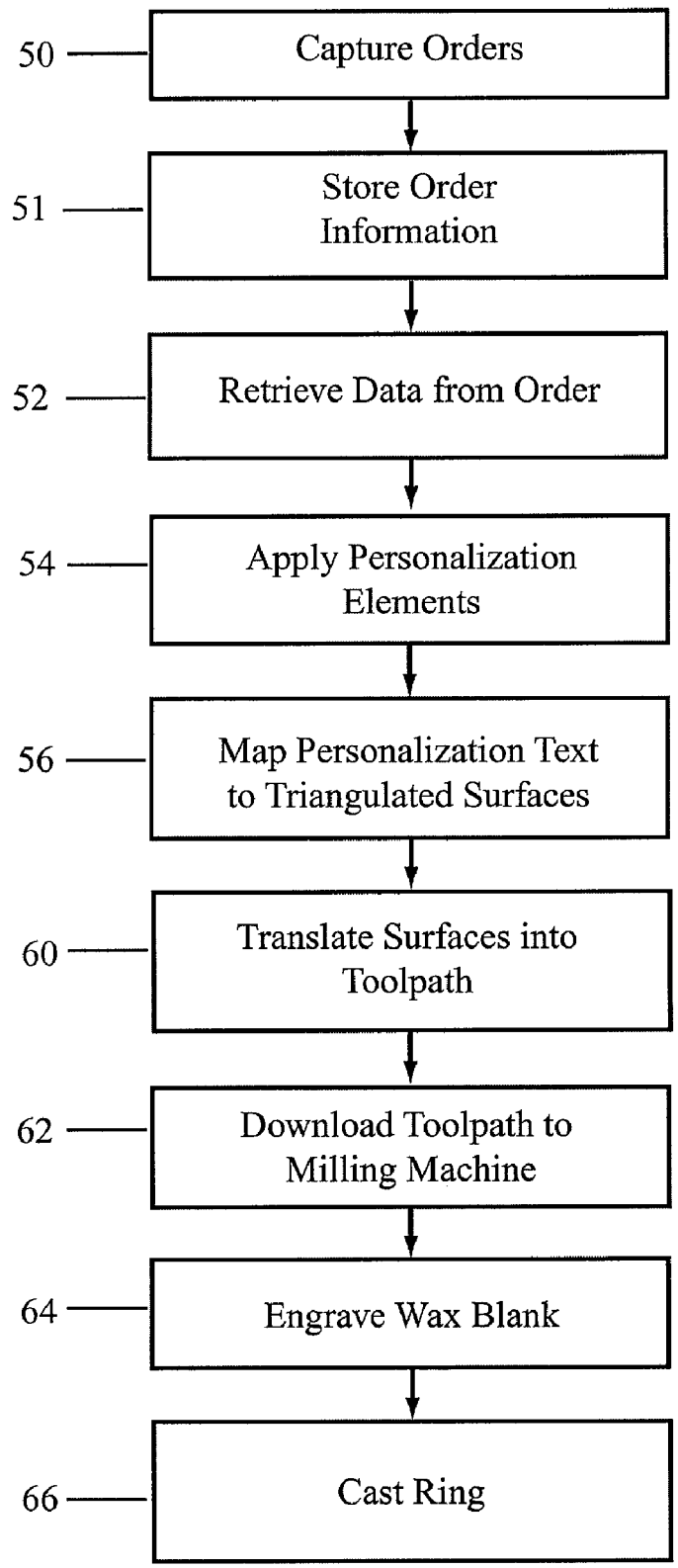
FIG. 7 illustrates a workflow diagram of creating a ring including the automated method for engraving a bezel of FIG. 2 in accordance with one embodiment.

FIG. 7 illustrates a workflow diagram of ring creation including the mapping of text of FIG. 2b. It is to be appreciated that all or portions of the embodiment shown in FIG. 2a may be automated, semi-automated, or manual. The level of automation of the method may be set based on the user, based on the desired output, or based on other criteria. Thus, each block of FIG. 2b may be automated such that after the initial order is read, an output is automatically triggered. Alternatively, the system and method may call for user interaction or involvement at any of the blocks of FIG. 2b.

As shown in FIG. 7, capturing of orders may be done by various channels [block 50]. For example, consumers may access a web-based interface for submitting an order and provide order information which may then be stored in a database. Alternatively, as has been traditionally done, students and their parents may fill out paper-based order forms that are turned into a sales representative. Each sales rep may forward a set of order forms to the manufacturer's data entry department, where a group of data entry clerks enter the orders into a computer repository database. There are other order channels available, such as by using an IVR (Interactive Voice Response) system with a telephone. Generally, order information may be stored for later use [block 51].

An interactive interface, such as a workstation, may be provided and managed by a production operator. Form this workstation the production operator may manually input items, map text (for example, via dragging and dropping the text), etc. Additionally, from this workstation, a computer software application can retrieve data for one of the pending orders [block 52]. The order for a class ring may include all of the personalization to be applied to the ring. For example, the order may specify which type of ring to use, where to engrave the student's name, what font to use, where to place school and year information, where to apply icons representative of the student's interests, etc. Alternatively, this type of information may be chosen and manually entered by the operator. The personalization elements are applied to a model of the ring [element 54]. The model may be a 3D virtual model. With specific reference to the bezel of the ring, the entered text for the bezel and, if included, at least one divider, are mapped to a 3D virtual model comprising a series of triangulated surfaces [element 56].

The triangulated surfaces may then be sent to a further software application that translates the triangulated surfaces into a series of instructions describing a path that a milling machine's cutting tool follows while machining a ring [block 60]. This set of instructions is commonly known as the "toolpath". Alternatively, the present system and method may convert the triangulated surfaces into the toolpath. The toolpath is downloaded to a milling machine [block 62] and a wax blank of the ring is engraved to the specifications ordered by the student [block 64]. The resulting wax model is then grouped with other wax models and the set of rings are cast and finished [block 66], resulting in the customized ring. Generally, using the system and method, the bezel of the customized ring should have minimal, if any, sharp edges or burrs requiring hand finishing.

Alternatively, as discussed with respect to FIG. 2a, the triangulated surfaces may be sent to a software application that translates the triangulated surfaces into a series of machine readable instructions for creating a customized item or the system and method may generate machine readable instructions for creating a customized item. The customized item may be, for example, a photo realistic image, an item manufactured via rapid prototyping, or other. Thus, the translation may describe a path that a image writer follows while producing a photo realistic image of the surface. As a further example, the translation may describe a path that a rapid prototyping machine follows while manufacturing a model of the surface.

Figure 8:
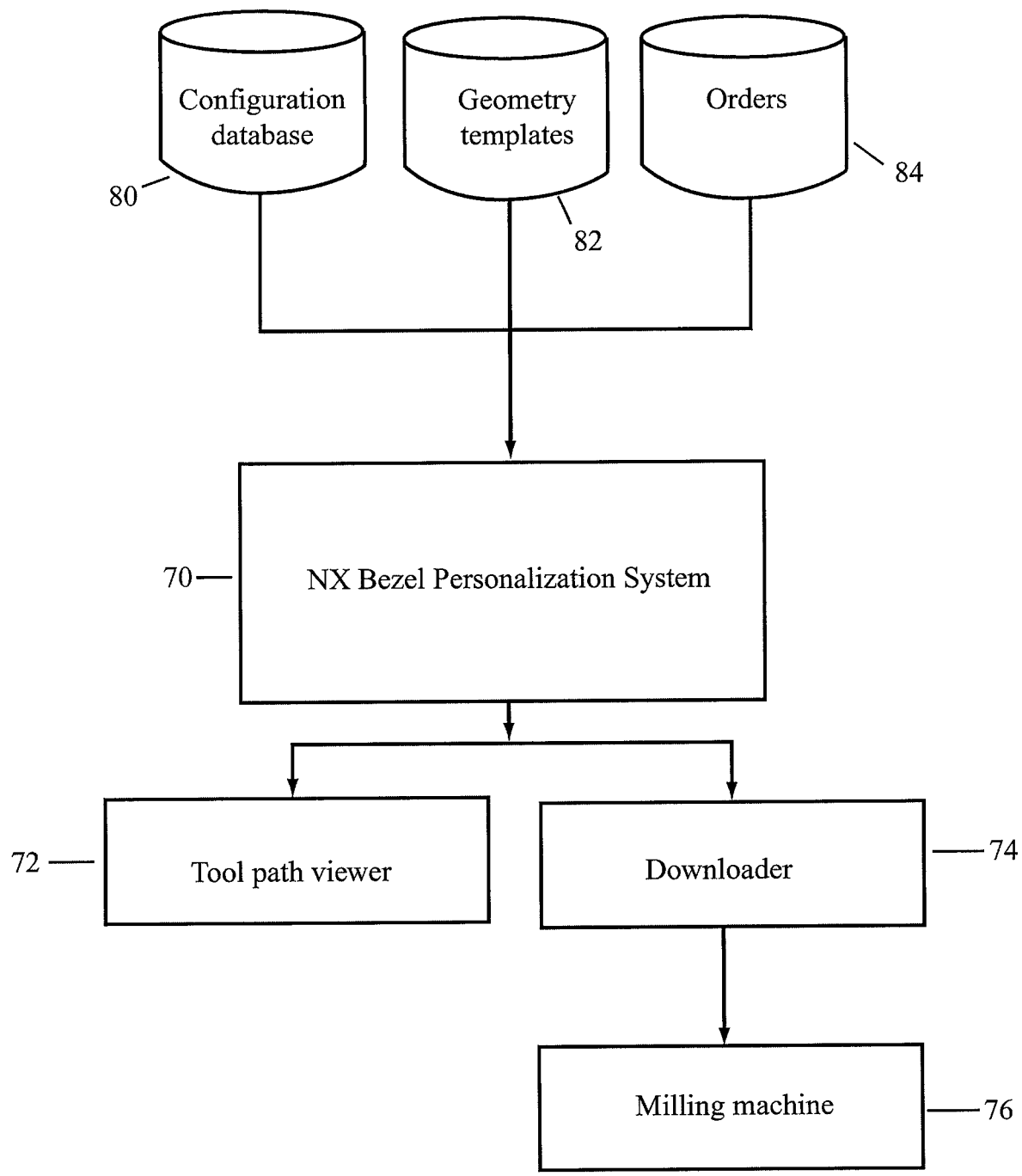
FIG. 8 illustrates a system architecture of a system for automated engraving of a bezel in accordance with one embodiment.

FIG. 8 shows the system architecture of one embodiment of an automated method for engraving a bezel. A NX Bezel Personalization System 70 is a computer program that provides the production operator with a graphical user interface. A plurality of databases may be provided for use with the system. For example, a configuration database 80 having information regarding data including general parameters about strategies for clean up, depth of cut, distance from lower rim, etc.; a geometry template database 82 having information regarding geometry of each hob (described below); and an order database 84 having information about placed orders such as hob number, personalization text, order number, etc. may be provided. The personalization client 70 searches the order database 84 for a file containing order requests, which in turn performs calculations to generate a generic toolpath for a milling machine that will result in a zinc (or other suitable material) bezel insert mold to be used to create the top of a ring as ordered. To do so, data may be retrieved from various databases, such as the order database 84, the geometry template files 82, and the configuration database 80.

A toolpath viewer 72 can be used to provide a preview visualization of what will result when the toolpath is applied to the bezel insert mold. In one embodiment, NC rendered viewer software (developed by Jostens) is used as the toolpath viewer 72. The toolpath viewer 72 may be used in troubleshooting, validations, setup, or to preview the appearance of the bezel insert mold. The preview may help to determine if the cutter has been broken during the NC Milling processing or if the mill is properly zeroed.

Once the NX Bezel Personalization System 70 assembles the generic toolpath (for example, Jostens's generic ascii GA) format file a post-processor (such as downloader 74) can be used to translate the generic toolpath to the mill-specific toolpath, which may be downloaded to the milling machine 76.

Figure 9:
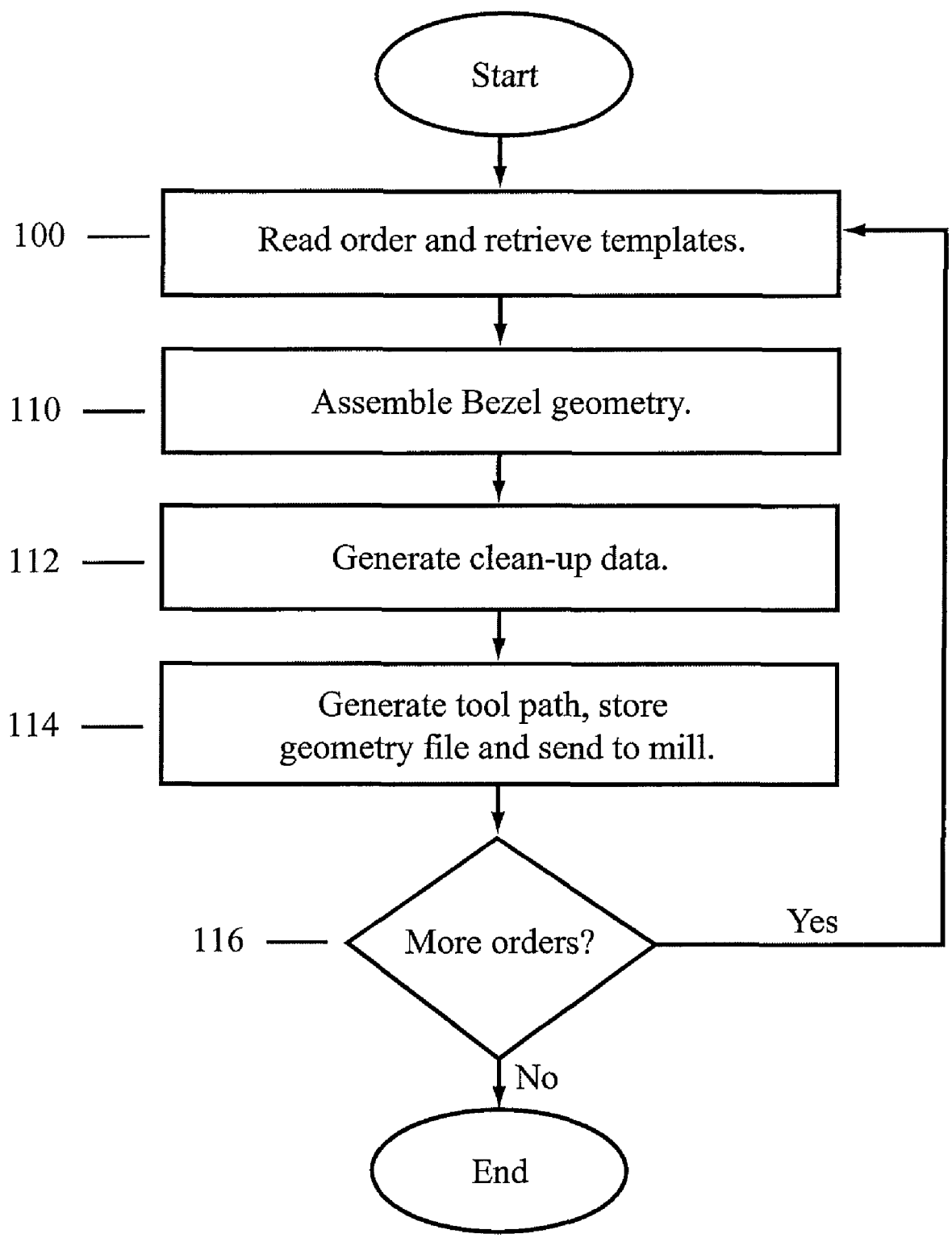
FIG. 9 illustrates detailed flow of retrieval of an order and corresponding geometric and parameter data for the given order in accordance with one embodiment.

FIG. 9 provides additional details for an automated method for engraving a bezel in accordance with one embodiment. As shown in FIG. 9, bezel information for the order to be processed is read or retrieved [block 100]. This information may include information about the text or dividers to be engraved on the bezel of the finished ring. From the order data, personalization information for the bezel is processed, the basic geometry for the bezel is generated [block 110, 112]. Personalization information may include triangulated surfaces for text and dividers and geometries for clean-up areas, as discussed in reference to FIG. 2b. The toolpath for the bezel is then created [block 114]. Once the geometric model (if used) shows desired personalization, a toolpath (set of machining instructions) is generated to create a ring to match the geometric model. Through this process flow, a high level of customization flexibility, such as the ability to project text and icons onto the bezel, is provided. After the tool path is generated and sent to a milling machine or stored [block 114], the system proceeds to look for more order data [block 116]. If more order data is retrieved, the process restarts. If no further order data is available, the process ends.

Figure 10:
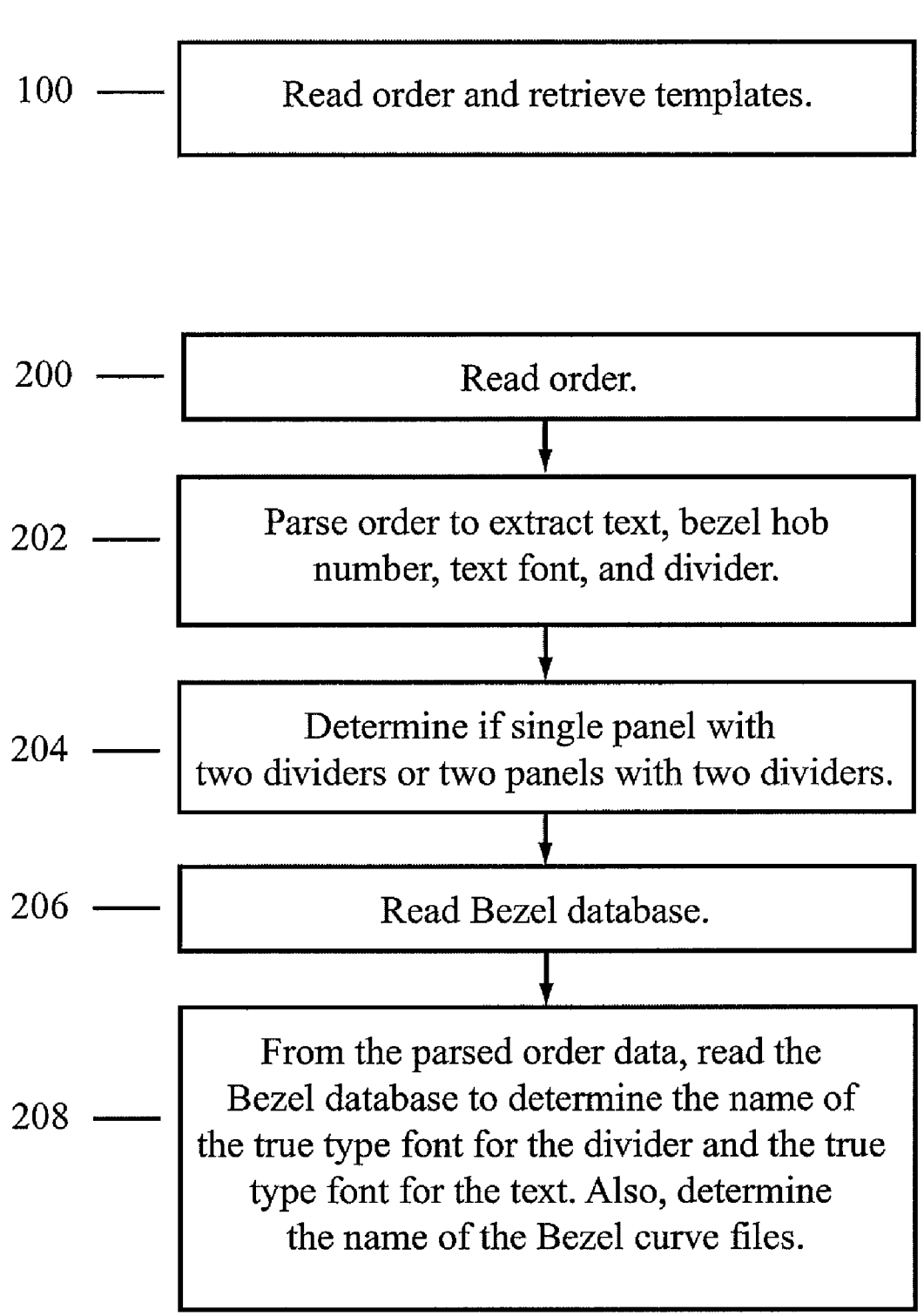
FIG. 10 illustrates a flowchart of retrieval of an order and corresponding geometric data in accordance with one embodiment.

FIG. 10 shows more detail of retrieval of templates and reading of orders (block 100 of FIG. 9). The order is read [block 200]. In block 200, information pertaining to the hob number for the particular bezel, the text to be engraved, the desired font of the text, and the desired dividers may be extracted from the order file. This information may be extracted as a single line The information is parsed, and each of the different entries is extracted [block 202]. From this parsed information, it is determined if the panel contains one divider or two dividers [block 204]. FIG. 3 illustrates the result of two dividers and FIG. 4 illustrates the result of one divider. The hob number specifies the product being personalized. For example, the hob number specifies which configuration parameters to use (i.e., boundary curves, fonts, machining strategies, different parameters that control the look of the text, the manner in which the specialized cleanout will be done, etc.). Based on the hob number information extracted, the bezel database is read [block 206]. Bezel information on the files that contain the different template geometries for the upper and lower text curves, and the surface of the bezel are stored in the bezel database. This information, as well as different strategies (or operations) to machine the bezel insert, may be retrieved [block 208]. Specifically, the Bezel database may be read to determine the font for the divider, the font for the text, and the name of the Bezel curve files.

Figure 11:
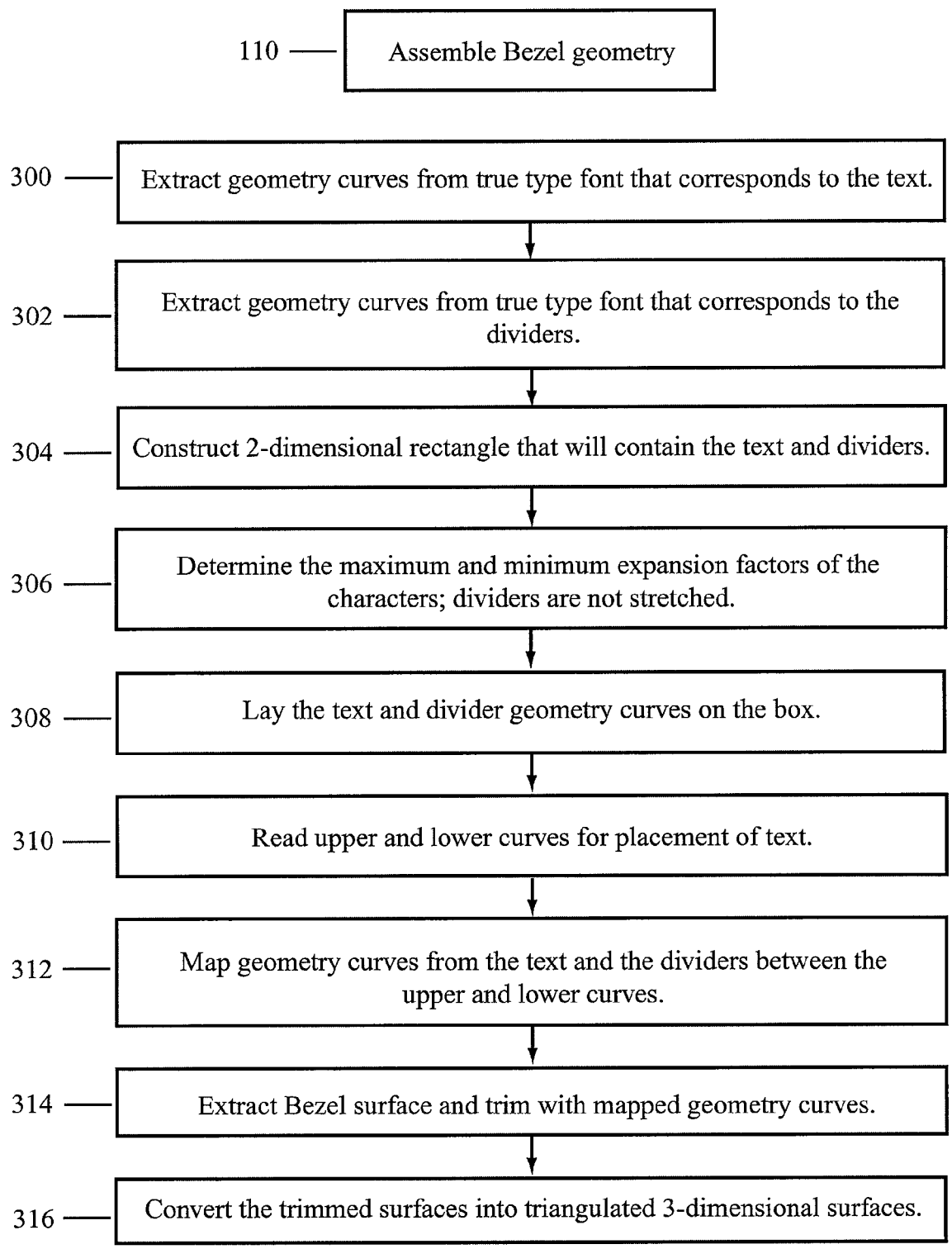
FIG. 11 illustrates assembling a bezel in accordance with one embodiment.

FIG. 11 shows more detail of creating the geometric model (block 110 of FIG. 9). FIG. 11 thus illustrates assembling the bezel geometry. The model for each type of ring includes a specific bezel. That bezel is retrieved from a repository including specific data for each bezel. Assembling the text geometry is preceded by retrieving the text requested by the customer as well as a hob number. The order data includes an indicator for the desired font to use in personalizing the text. In one embodiment, this is retrieved and the operating system is queried for the appropriate font geometry. Thus, in the embodiment shown, curve data for a TrueType brand typographic font that corresponds to the text is extracted [block 300]. Similarly, curve data for the dividers is extracted [block 302]. In a further embodiment, each character may be mapped independently between two portions of a curve, for example, using CORE software available from Jostens.

Figure 16:
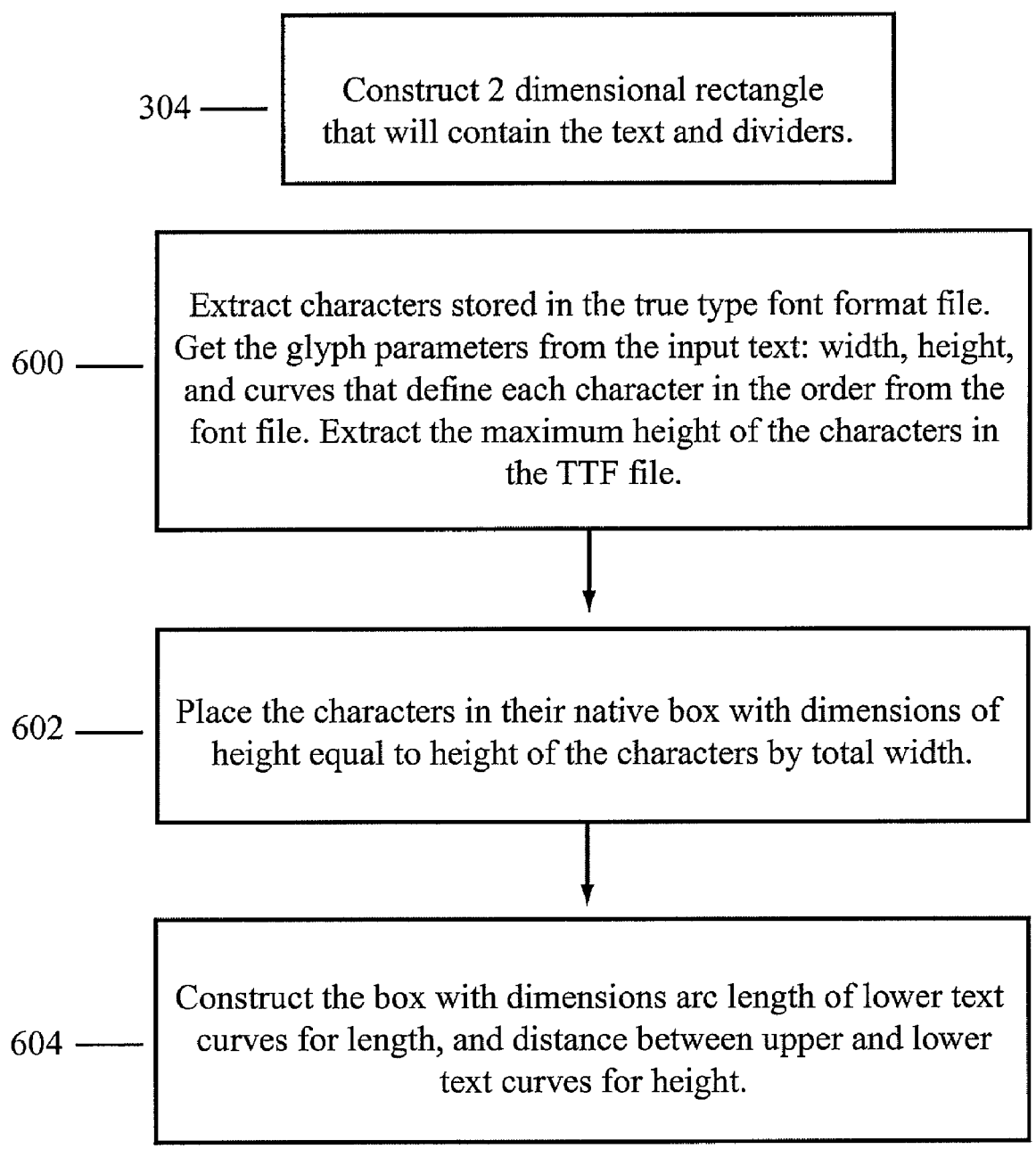
FIG. 16 illustrates constructing a rectangle or bounding box containing text and dividers in accordance with one embodiment.

A 2-dimensional rectangle to contain the text and dividers is constructed [block 304]. FIG. 16 illustrates the construction of block 304 in further detail. The characters of the text are extracted from the corresponding font file [block 600]. In the embodiment shown, the font file is a true type font format file (TTF file). Character extraction may include extracting glyph parameters from the input text including width, height, and curves. These parameters define each character in an order based on the font file. A maximum height of the characters may also be extracted. As shown, the height may be extracted from the TTF file. The characters are placed in a native box having dimensions of height equal to height of the characters by total width [block 602]. A box (or rectangle) is constructed having a height and a length [block 604]. The length is approximately equal to the sum of the widths associated to the natural glyph of each character in the input order. The height is approximately equal to the total height of the characters in the alphabet.

Figure 18:
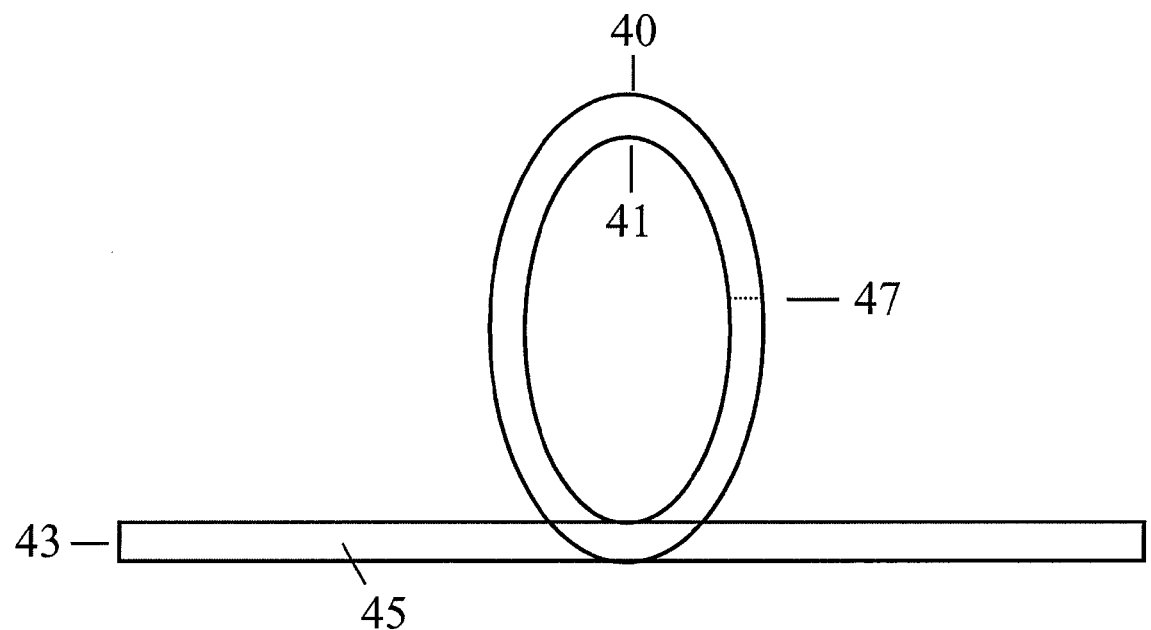
FIG. 18 illustrates determining the dimensions of the bounding box of FIG. 16 in accordance with one embodiment.
Figure 19:
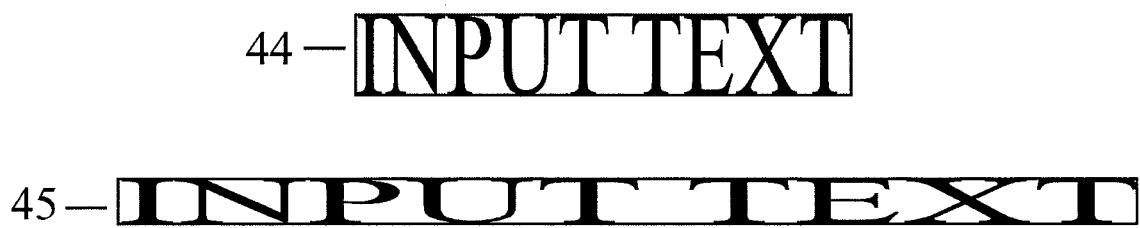
FIG. 19 illustrates sample input text and resulting mapped text in accordance with one embodiment.

Reference is now made to FIGS. 18 and 19 to illustrate construction of the box [block 604 of FIG. 16]. An example of input text 44 and a corresponding bounding box 45 with the input text are shown in FIG. 19. As shown in FIG. 18, the box 45 is constructed with dimensions of length equal to the arc length 43 of the lower text curve 41 and height equal to the distance 47 between the lower text curve and upper text curve.

Figure 17:
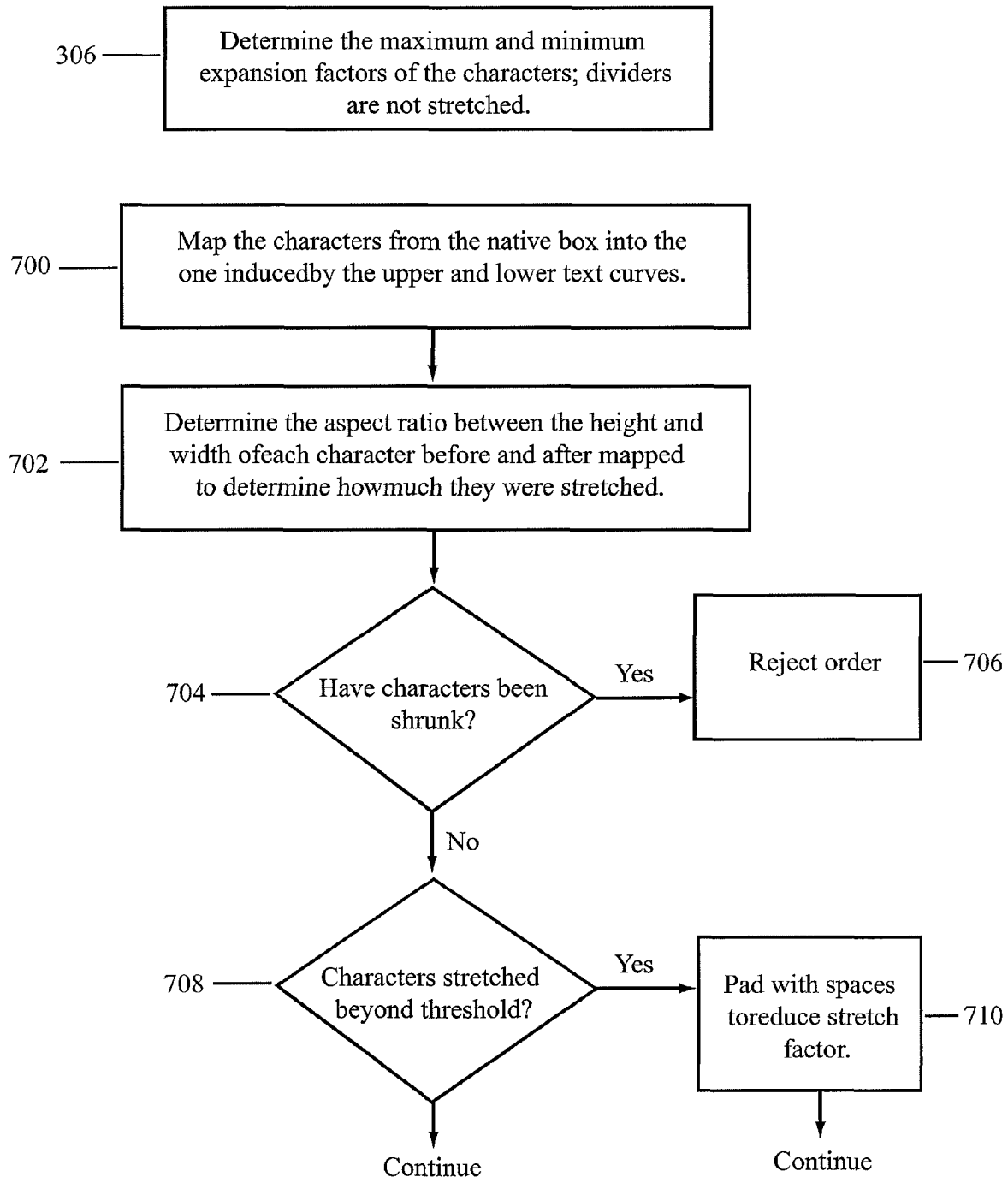
FIG. 17 illustrates determining minimum and maximum expansion factors for text in accordance with one embodiment.

Returning now to FIG. 11, the character curves or text curves extracted in blocks 300, 302 are mapped to the 2D rectangle (or box) constructed in block 304 (see, for example, FIGS. 18 and 19) to determine maximum and minimum expansion factors for text characters. Generally the dividers are not stretched. As discussed previously, FIG. 19 illustrates a sample input text 44 with resulting mapped text 45. For mapping, the maximum and minimum expansion factors for text characters are determined 306. FIG. 17 illustrates further detail of mapping the character curves to the box, and, more specifically, of determining minimum and maximum expansion factors. As shown, the characters are mapped from the native box to the box induced by the upper and lower text curves [block 700]. The aspect ratio between the width and the height of each of the characters is calculated before and after the mapping [block 702]. The aspect ratio is used to determine the expansion or stretching of each character. An inquiry is performed to determine if the aspect ratio is smaller than the original aspect ratio, and thus whether the characters have been shrunk [block 704]. If the aspect ratio is smaller than the original aspect ratio, the order is rejected [block 706]. If the aspect ratio is not smaller than the original aspect ratio, an inquiry is performed to determine whether the characters were stretched beyond a given threshold [block 708]. If the aspect ratio is larger than the given threshold, the characters are padded with spaces, thus reducing the stretch factor, until the threshold is met [block 710].

Thus, returning FIG. 11, geometry for text characters and dividers are extracted [blocks 300, 302], a box is constructed to contain the text and dividers [block 304], and the maximum and minimum expansion factors of the characters is determined [block 306]. When the aspect ratio described above is within a given threshold, the text and divider geometry curves are laid on the constructed box [block 308]. The upper and lower curves for placement of the text are read [block 310] and the geometry curves from the text and dividers are mapped between the upper and lower curves [block 312]. The upper and lower curves define the bezel shape in two dimensions. The text may be mapped using first and second lines of text, one over the gemstone and one below the gemstone, or a single line of text wrapping around the gemstone. The text and dividers thus follow the shape of the two boundaries: the upper and lower curves. Bezel surface and trim are extracted with mapped geometry curves [block 314] and the mapped data is converted into triangulated three dimensional surfaces [block 316].

Figure 20:
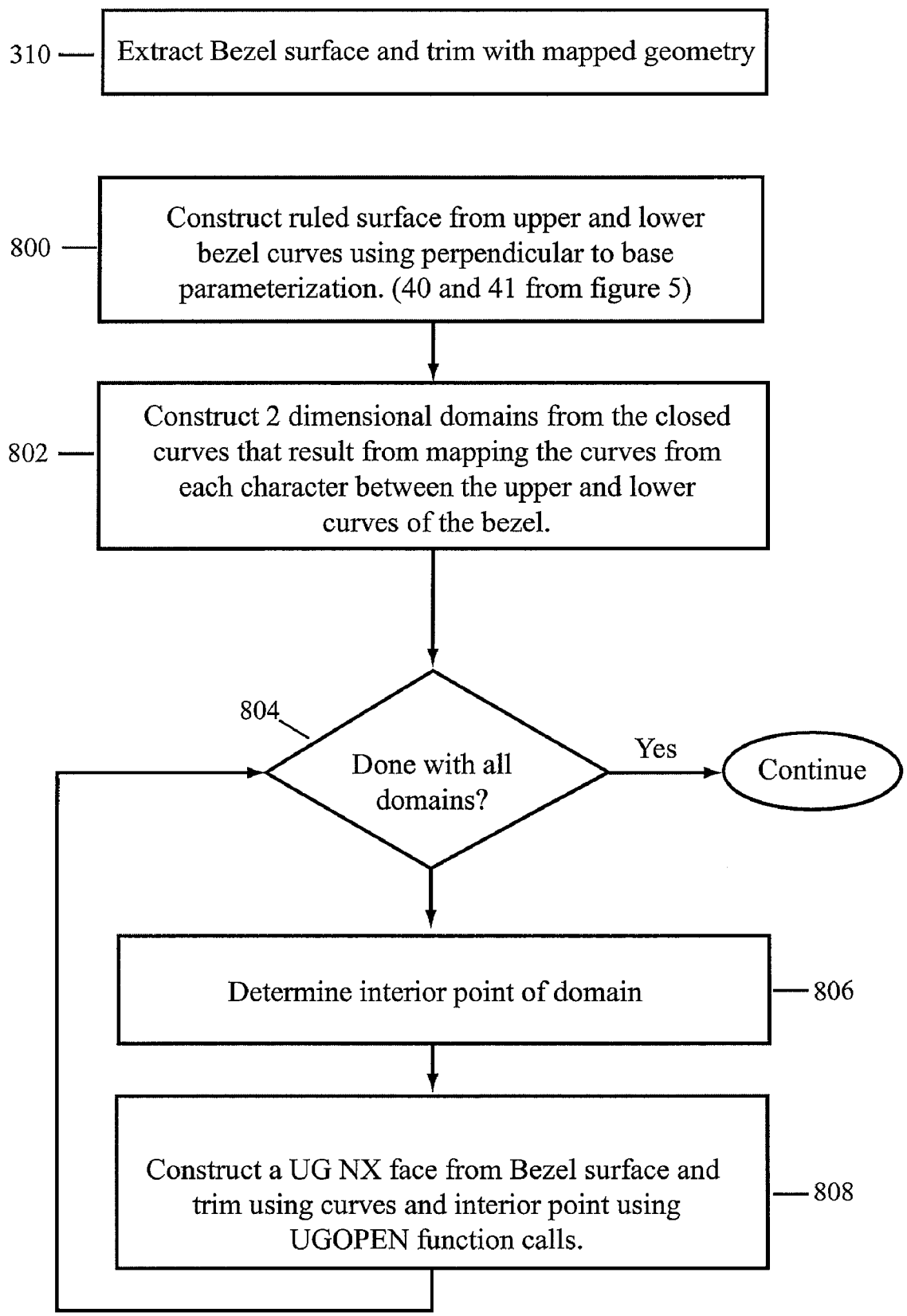
FIG. 20 illustrates detail of an extraction of a bezel surface and trim with mapped geometry in accordance with one embodiment.

FIG. 20 illustrates more detail of an extraction of a bezel surface and trim with mapped geometry (block 314 of FIG. 11). As shown, ruled surfaces are constructed from upper and lower bexel curves using perpendicular to base parameterization [block 800]. The two-dimensional domains are constructed from the closed curves that result from mapping the curves from each character between the upper and lower curves of the bezel [block 802]. An inquiry is performed to determine if all of the two-dimensional domains have been constructed [block 804]. If all of the domains have not been constructed, an interior point of a domain is determined [block 806]. A UG NX face is constructed from the bezel surface and trim using curves and the interior point using UGOPEN function calls [block 808]. Alternatively, an interior point of a domain is determined [block 806] and a UG NX face is constructed from the bezel surface and trim using curves and the interior point using UGOPEN function calls [block 808] prior to the inquiry to determine if all of the two-dimensional domains have been constructed [block 804].

Figure 12:
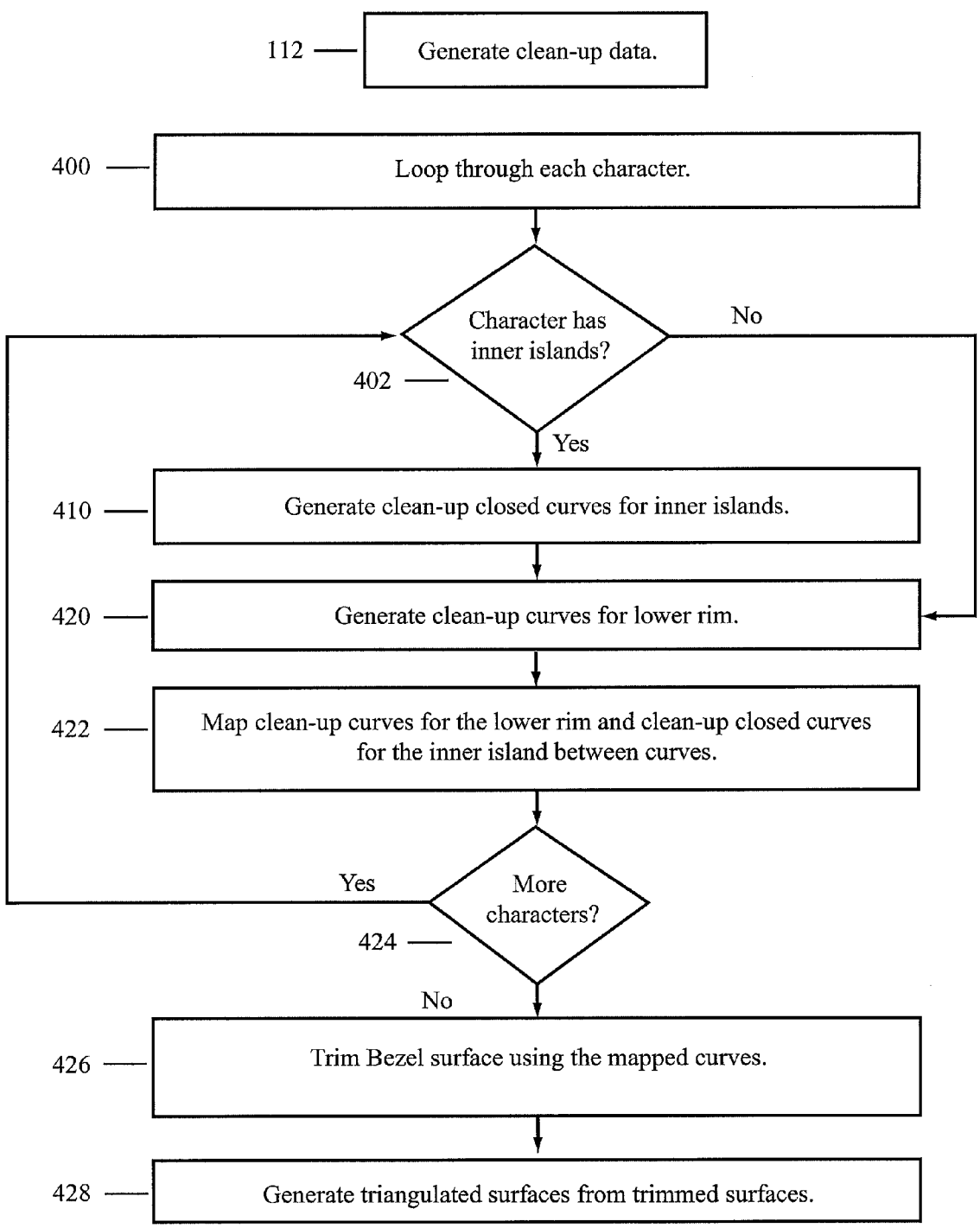
FIG. 12 illustrates a flowchart of the generation of clean-up data in accordance with one embodiment.

FIG. 12 shows more detail of generation of clean-up data (block 112 of FIG. 9). Each character is looped through each character [block 400]. Clean-up curves for the lower rim are generated [block 420]. A determination is made of whether the character has inner islands [block 402]. If the character has inner islands, clean-up closed curves are generated for the inner islands [block 410]. The clean-up curves for the lower rim and the clean-up closed curves for the inner island (when the character has an inner island) are mapped between closed curves [block 422]. This process is done for each character. When clean-up curves for each character have been mapped, the bezel surface is trimmed using the mapped curves [block 424]. Triangulated surfaces are then generated from the trimmed surfaces [block 426].

Figure 13:
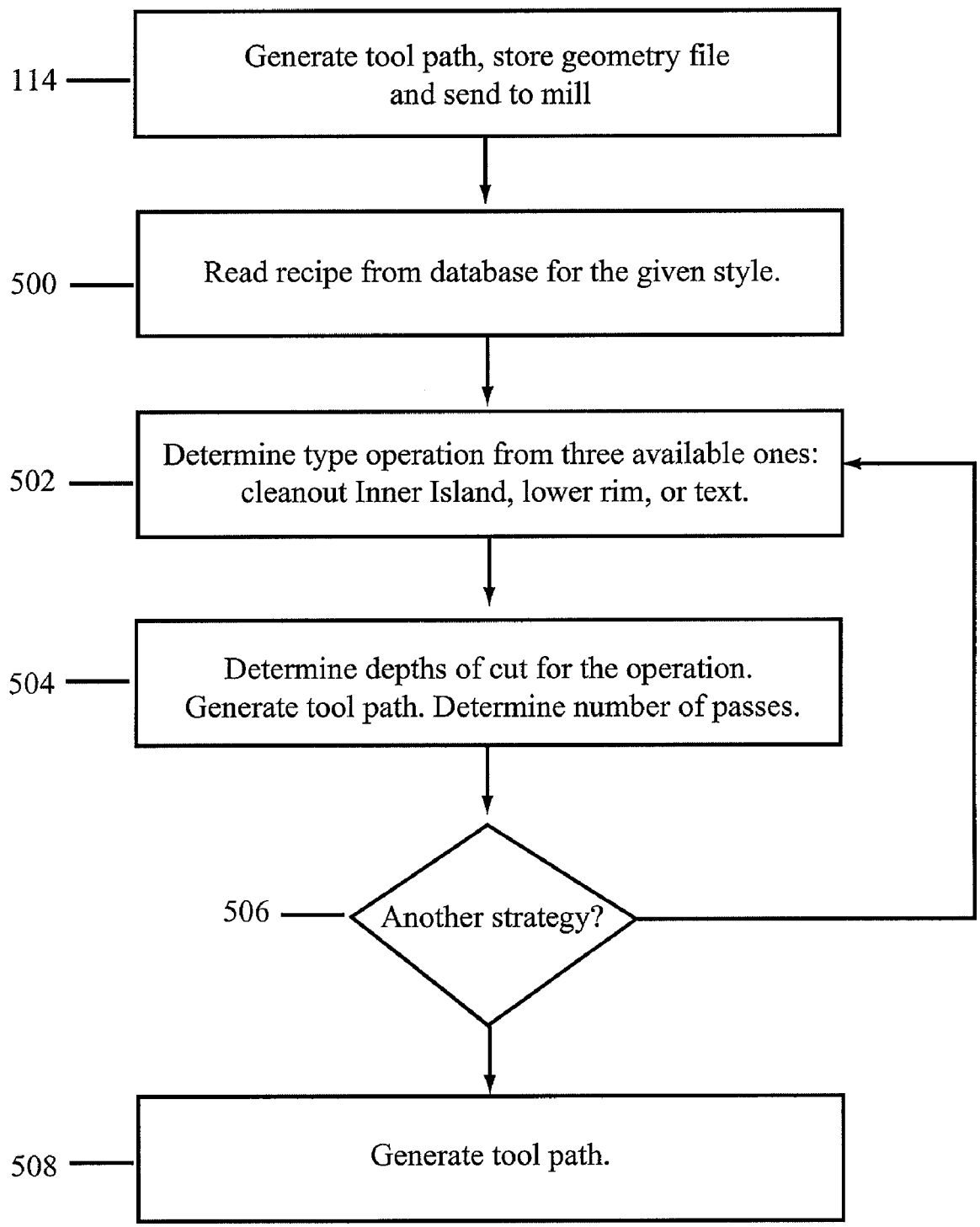
FIG. 13 illustrates a flowchart of the generation of tool path and storage of geometric data in accordance with one embodiment.

FIG. 13 shows more detail of generation of the tool path, storage of the geometry file, and sending of the tool path to the milling machine (block 114 of FIG. 9). As shown, a recipe, or set of machining strategies or operations to be used, is read from the configuration database for a given HOB (or style) [block 500]. The type of operation (or strategy) to be performed is determined [block 502]. The type of operation may be, for example, clean out the inner island, clean out the lower rim, or cut the text. Different cutters or tools may be used for each operation. Depths of cut are determined for the selected operation [block 504]. A tool path is generated and a number of passes of the cutter is determined. A determination is made about whether another strategy or type of operation (referring back to block 502) is to be performed [block 506]. After all types of operations (or all types of selected operations) have been reviewed, a tool path including all types of operations is generated [block 508].

In one embodiment, mapping of the text is accomplished with the font geometry information. The splines are tessellated to generate a polyline set for each character of the text. The text characters are mapped into a 2D rectangular domain using the kerning information provided with the TrueType font. Because kerned type is often more pleasant looking than fixed-spaced type, each of the polyline sets are spaced based on kerning data supplied with the font geometry. The spacing is adjusted to meet the minimum spacing requirements associated with the bezel. Once this modification of the text is finished, the polyline sets are mapped between the boundary curves so that the characters or icon curves follow the shape of the two boundaries. To do this, a ruled surface is defined between the two curves, as at block 310 of FIG. 11. This ruled surface comprises the bezel. Such a process is discussed in "The NURBS Book" by Les Piegl and Wayne Tiller (pages 337-339). Reference is made to FIG. 17 for further discussion of mapping characters into a bezel.

The parameterization of the boundary curves will determine the type of mapping. Two basic maps are used in one embodiment: "parallel to ends" and "perpendicular to base." Using a "parallel to ends" technique, the vertical legs of each text character are defined by an interpolation of the slopes of the left and right edges of the boundary shape. Using a "perpendicular to base" technique, the vertical legs of the characters are defined as being perpendicular to the base curve of the boundary shape.

In some embodiments, configuration parameters are retrieved from a repository. The configuration parameters vary for each ring design. Thus, for each ring, the repository may store such data as the font name, character spacing, character thickness, character type (such as raised, incised, etc.), boundary curves, cutter type, and machining pattern.

One exemplary method of building the toolpath is as follows. A set of machining patterns and information for the associated cutting tools are retrieved. There are several machining patterns (a.k.a. strategies) available. While other strategies may be used, reference is made particularly to vornoi, or profile, patterns and raster patterns. A profile pattern is where Voronoi diagram techniques are used to generate 2D offsets defined by text geometry, cutting tool shape, and cutting depth. Generally, a profile pattern is a nested loop. A raster pattern is where Voronoi diagram techniques are used to generate 2D offsets defined by text geometry, cutting tool shape, and cutting depth. A raster pattern may alternatively be referred to as a parallel lines pattern. (Other machining patterns can be implemented in various embodiments of the invention. For instance a 3D curve matching pattern may be used in certain embodiments such as for cleaning up the rim of the bezel.

In one embodiment, the geometry being machined is approximated by 2½-dimensional geometry. That is, it is assumed that the objects are two dimensional with a nearly constant z-height. This assumption is valid for many of the ring manufacturing designs. Thus, once the machining patterns are retrieved, the 2½-dimensional toolpath is generated by retrieving the type of pattern specified. If the pattern requested is "profile", the 2½-dimensional toolpath for the profile pattern is generated. If the pattern requested is "raster", the 2½-dimensional toolpath for the raster pattern is generated. Otherwise, a full or light skeleton toolpath is generated. The toolpath generated for the personalization element is (in one embodiment) either a simultaneous 4-axis toolpath or a positional 4-axis toolpath. In the simultaneous version, the rotational axis is moving from one tool location to another continuously while in the positional version, the tool will remain at a constant rotational axis position, changing only from one panel to the other.

At the next step of the process, the toolpath is projected onto the surface of the ring. This generates the corresponding three-dimensional toolpath. Once the projection is accomplished, the toolpath is rotated by a specified angle to achieve the final toolpath for that particular personalization panel.

For the skeleton strategy pattern, the present invention gets a point in the remaining set of edges from the Voronoi diagram. The distance from that point to the text or icon curves is determined. Next, the depth that corresponds to an effective radius equal to the calculated distance is assigned as a z-value. The point with z-value is added to the toolpath. This repeats for additional points.

For profile and raster strategy patterns, the present invention first gets a point in the remaining set of edges in the Voronoi diagram. Then the depth of cut is assigned as a z-value and the point is added with that z-value to the toolpath. This repeats for additional points.

While the present disclosure describes the system and method in the context of creating triangulated surfaces convertible to a tool path for a bezel, alternatively, the system and method may create triangulated surfaces convertible to machine readable instructions for any desired output. In one embodiment, the system and method may create triangulated surfaces convertible to machine readable instructions for creation of a rapid prototyping model. For example, the triangulated surfaces may be sent to a software application that translates the triangulated surfaces into a series of instructions describing a path that a rapid prototyping machine follows while manufacturing a model of the surface. Generally, rapid prototyping refers to the transformation of virtual designs into thin, virtual, horizontal cross-sections and then creating each cross-section in physical space, one after the next to create a model of the virtual design.

Additionally, in an alternative embodiment, the system and method may create triangulated surfaces convertible to machine readable instructions for creation of a photorealistic image, such as a poster. For example, the triangulated surfaces may be sent to a software application that translates the triangulated surfaces into a series of instructions describing a path that a image writer follows while producing an image of the surface.

Although the invention has been described with reference to preferred embodiments, persons skilled in the art will recognize that changes may be made in form and detail without departing from the spirit and scope of the invention.

The invention claimed is:

1. A method of creating a triangulated surface for engraving an item, the method comprising:
   selecting text;
   placing the text;
   spacing the text or symbols, wherein spacing the text is performed on the basis of the selected text;
   mapping the text between first and second curves, wherein mapping includes determining maximum and minimum expansion factors for the text and mapping based on these expansion factors;
   generating triangulated surfaces from the mapped text;
   identifying areas for clean up and generating clean up lines; and
   converting the triangulated surfaces, including the clean-up lines, into machine readable instructions for the generation of a tool path.

2. The method of claim 1, wherein selecting text further comprises selecting at least one divider and wherein spacing the text further comprises placing the at least one divider and mapping the text comprises mapping the at least one divider.

3. The method of claim 1, further comprising identifying areas for clean up and generating clean-up lines.

4. The method of claim 3, wherein clean-up comprises the elimination of sharp edges and burrs.

5. The method of claim 1, wherein the first curve has a shape different from the second curve.

6. The method of claim 1, wherein the first and second curves from a bezel.

7. A method for creating a triangulated surface convertible to a series a machine readable instructions, the method comprising:
   defining a shape for placement of text;
   defining the text for placement on the shape;
   placing the text on the shape as triangulated surfaces, wherein placing the text is performed on the basis of the defined text;
   mapping the text on the shape, wherein mapping includes determining maximum and minimum expansion factors for the text and mapping based on these expansion factors; and
   converting the triangulated surfaces to machine readable instruction for generation of a customized item.

8. The method of claim 7, wherein the shape comprises an upper and lower closed curve.

9. The method of claim 7, wherein the text comprises one or more lines of text.

10. The method of claim 8, wherein placing the text comprises spacing the text within the upper and lower closed curves.

11. The method of claim 10, wherein the placed text are mapped between the upper and lower close curves.

12. The method of claim 11, wherein the triangulated surfaces are generated from the mapped text.

13. The method of claim 7, wherein the triangulated surfaces are converted to machine readable instructions for the generation of a tool path.

14. The method of claim 13, further comprising identifying areas for clean up and generating clean-up lines.

15. The method of claim 7, wherein the triangulated surfaces are converted to machine readable instructions for the generation of a photorealistic image.

16. The method of claim 7, wherein the triangulated surfaces are converted to machine readable instructions for the generation of a rapid prototyping model.

17. A computer-readable medium encoded with a computer program code for creating a triangulated surface convertible to a series of machine readable instructions, the program code causing a computer to execute a method comprising:

defining a shape for placement of text;

defining the text for placement on the shape;

placing the text on the shape as triangulated surfaces, wherein placing the text is performed on the basis of the defined text;

mapping the text on the shape, wherein mapping includes determining maximum and minimum expansion factors for the text and mapping based on these expansion factors; and converting the triangulated surfaces to machine readable instructions for generation of a desired output.

18. The computer-readable medium of claim 17, wherein the triangulated surfaces are converted to machine readable instructions for the generation of a tool path.

* * * * *